US006190831B1

(12) United States Patent
Leon et al.

(10) Patent No.: US 6,190,831 B1
(45) **Date of Patent: *Feb. 20, 2001**

(54) PROCESSLESS DIRECT WRITE PRINTING PLATE HAVING HEAT SENSITIVE POSITIVELY-CHARGED POLYMERS AND METHODS OF IMAGING AND PRINTING

(75) Inventors: Jeffrey W. Leon, Rochester, NY (US); Gary M. Underwood, North Jupiter, FL (US); James C. Fleming, Webster; Charles D. Deboer, Palmyra, both of NY (US)

(73) Assignee: Kodak Polychrome Graphics LLC, Norwalk, CT (US)

( * ) Notice: Under 35 U.S.C. 154(b), the term of this patent shall be extended for 0 days.

This patent is subject to a terminal disclaimer.

(21) Appl. No.: 09/310,038

(22) Filed: May 11, 1999

Related U.S. Application Data

(63) Continuation-in-part of application No. 09/163,020, filed on Sep. 29, 1998, now abandoned.

(51) Int. Cl.[7] ...................................................... G03F 7/004
(52) U.S. Cl. ........................ 430/270.1; 430/302; 101/467
(58) Field of Search ............................. 430/270.1, 271.1, 430/926, 302, 303; 101/467

(56) References Cited

U.S. PATENT DOCUMENTS

| | | | | |
|---|---|---|---|---|
| 3,964,389 | | 6/1976 | Peterson | 101/467 |
| 4,034,183 | | 7/1977 | Uhlig | 219/122 |
| 4,081,572 | | 3/1978 | Pacansky | 427/53 |
| 4,405,705 | | 9/1983 | Etoh et al. | 430/270 |
| 4,548,893 | | 10/1985 | Lee et al. | 430/296 |
| 4,634,659 | | 1/1987 | Esumi et al. | 430/302 |
| 4,693,958 | | 9/1987 | Schwartz et al. | 430/302 |
| 4,920,036 | * | 4/1990 | Totsuka et al. | 430/270 |
| 5,460,918 | | 10/1995 | Ali et al. | 430/200 |
| 5,512,418 | | 4/1996 | Ma | 430/271.1 |
| 5,569,573 | | 10/1996 | Takahashi et al. | 430/138 |
| 5,691,103 | * | 11/1997 | Totsuka et al. | 430/270 |

FOREIGN PATENT DOCUMENTS

| | | | |
|---|---|---|---|
| 0 652 482 A1 | | 11/1993 | (EP) . |
| 609 930 | * | 8/1994 | (EP) . |
| 0615162 | | 9/1994 | (EP) . |
| 58-097042 | | 6/1983 | (JP) . |
| 92/09934 | | 11/1990 | (WO) . |
| 9739894 | | 10/1997 | (WO) . |

OTHER PUBLICATIONS

Rosen, Stephen L. Fundamental Princples of Polymeric Materials, Second Edition. New York John: Wiley & Sons, Inc., (1993), pp. 15–18.*

Grant, Julius. Hackh's Chemical Dictionary, Fourth Edition. New York: McGraw–Hill Book Company, pp. 515, 646–647.*

* cited by examiner

*Primary Examiner*—Janet Baxter
*Assistant Examiner*—Barbara Gilmore
(74) *Attorney, Agent, or Firm*—Baker Botts L.L.P.

(57) ABSTRACT

An imaging member, such as a negative-working printing plate, can be prepared using a hydrophilic imaging layer comprised of a heat-sensitive hydrophilic polymer having a positively charged moiety, and optionally a photothermal conversion material. The heat-sensitive polymer has recurring units containing an N-alkylated aromatic heterocyclic group or an organoonium group that reacts to provide increased oleophilicity in areas exposed to energy that provides or generates heat. For example, heat can be supplied by laser irradiation in the IR region of the electromagnetic spectrum. Thus, the heat-sensitive polymer is considered “switchable” in response to heat, and provides an imaging means without wet processing.

25 Claims, No Drawings

PROCESSLESS DIRECT WRITE PRINTING PLATE HAVING HEAT SENSITIVE POSITIVELY-CHARGED POLYMERS AND METHODS OF IMAGING AND PRINTING

CROSS-REFERENCE TO RELATED APPLICATIONS

This application is a Continuation-in-part application of commonly assigned U.S. Ser. No. 09/163,020 filed Sep. 29, 1998, by Leon, Underwood, Fleming now abandoned and DeBoer.

FIELD OF THE INVENTION

This invention relates in general to lithographic imaging members, and particularly to lithographic printing plates that require no wet processing after imaging. The invention also relates to a method of digitally imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and an ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}YAG$ laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. CO2 lasers are described for ablation of silicone layers by Nechiporenko & Markova, PrePrint 15th International IARIGAI Conference, June 1979, Lillehammer, Norway, Pira Abstract 02-79-02834.

Typically, such printing plates require at least two layers on a support, one or more being formed of ablatable materials. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Reissue 35,512 (Nowak et al), and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat. U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high powered lasers is undesirable in the industry because of their high electrical power requirements, and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. The imaged materials also require wet processing after imaging.

Thermal processes using polyamic acids and vinyl polymers with pendant quaternary ammonium groups are described in U.S. Pat. No. 4,693,958 (Schwartz et al), but wet processing is required after imaging.

U.S. Pat. No. 5,512,418 (Ma) describes the use of polymers having cationic quaternary ammonium groups that are heat-sensitive. However, like most of the materials described in the art, wet processing is required after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

The graphic arts industry is seeking alternative means for providing a processless, direct-write lithographic printing plate that can be imaged without ablation and the accompanying problems noted above. It would also be desirable to use "switchable" polymers without the need for wet processing after imaging, to render an imaging surface more oleophilic in exposed areas.

SUMMARY OF THE INVENTION

The problems noted above are overcome with an imaging member comprising a support having thereon a hydrophilic imaging layer comprising a hydrophilic heat-sensitive polymer selected from the following two types of polymers:

I) a vinyl polymer comprising recurring units comprising positively-charged, pendant N-alkylated aromatic heterocyclic groups, and II) a non-vinyl polymer comprising recurring organoonium groups.

This invention also includes a method of imaging comprising the steps of:

A) providing the imaging member described above, and

B) imagewise exposing the imaging member to provide exposed and unexposed areas in the imaging layer of the imaging member, whereby the exposed areas are rendered more oleophilic than the unexposed areas by heat provided by the imagewise exposing.

Still further, a method of printing comprises the steps of carrying out steps A and B noted above, and additionally:

C) contacting the imaging member with a fountain solution and a lithographic printing ink, and imagewise transferring that printing ink from the imaging member to a receiving material.

The imaging members of this invention have a number of advantages, and avoid the problems of previous printing plates. Specifically, the problems and concerns associated with ablation imaging (that is, imagewise removal of a surface layer) are avoided because the hydrophilicity of the imaging layer is changed imagewise by "switching" (preferably, irreversibly) exposed areas of its printing surface to be less hydrophilic (that is, become more oleophilic when heated). A generally hydrophilic heat-sensitive imaging polymer is rendered more oleophilic upon exposure to heat (such as provided or generated by IR laser irradiation or other energy source). Thus, the imaging layer stays intact during and after imaging (that is, no ablation is required). These advantages are achieved by using a hydrophilic heat-sensitive polymer having recurring cationic groups within the polymer backbone or chemically attached thereto. Such polymers and groups are described in more detail below. The polymers used in the imaging layer are readily prepared using procedures described herein, and the imaging members of this invention are simple to make and use without the need for post-imaging wet processing. The resulting printing members formed from the imaging members of this invention are negative-working.

Highly ionic polymers in imaging members is that such polymers tend to be more water-soluble, and may wash off the imaging member when exposed to a fountain solution during printing. While imaging of such polymers can render them more oleophilic, not all of the charged groups "switch" to an uncharged state. Thus, even the exposed areas of the printing surface may have too many hydrophilic groups remaining. This small proportion of water-soluble groups has been found to induce water solubility and resulting adhesion or cohesion failure after imaging. The present invention provides preferred embodiments having crosslinked vinyl polymers having cationic groups. The crosslinking provides improved structural stability of the imaging layer during printing operations.

In other embodiments of this invention, namely for the non-vinyl polymers described herein, further advantages are evident. Polymers with non-vinyl backbones often have high ceiling temperatures and are less prone to side reactions and unwanted thermal degradation than vinyl based polymers. In addition, many non-vinyl polymers show particularly good adhesion to a variety of commonly used support materials. The combination of these factors results in thermally imageable layers that maintain their structural integrity especially well, even when exposed to relatively high laser power.

DETAILED DESCRIPTION OF THE INVENTION

The imaging members of this invention comprise a support and one or more layers thereon that are heat-sensitive. The support can be any self-supporting material including polymeric films, glass, ceramics, cellulosic materials (including papers), metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum sheets having a thickness of from about 100 to about 600 $\mu$m. The support should resist dimensional change under conditions of use.

The support may also be a cylindrical surface such as an on-press printing cylinder or sleeve as described in U.S. Pat. No. 5,713,287 (Gelbart). The switchable polymer composition can be coated directly onto the cylindrical surface, which is an integral part of the printing press. The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) known for such purposes in the photographic industry, vinylphosphonic acid polymers, alkoxysilane (such as aminopropyltriethoxysilane and glycidoxypropyltriethoxysilane), titanium sol gel materials, epoxy functional polymers, and ceramics.

The back side of the support may be coated with antistatic agents and/or slipping layers or matte layers to improve handling and "feel" of the imaging member.

The imaging members, however, preferably have only one heat-sensitive layer that is required for imaging. This hydrophilic layer includes one or more heat-sensitive polymers, and optionally but preferably a photothermal conversion material (described below), and preferably provides the outer printing surface of the imaging member. Because of the particular polymer(s) used in the imaging layer, the exposed (imaged) areas of the layer are rendered more oleophilic in nature.

The heat-sensitive polymers useful in the practice of this invention can be of two broad classes of materials:

I) crosslinked or uncrosslinked vinyl polymers comprising recurring units comprising positively-charged, pendant N-alkylated aromatic heterocyclic groups, and II) non-vinyl polymers comprising recurring organoonium groups.

Each type of polymer is described in turn:

Type I Polymers:

The heat-sensitive polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare all of these types of polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to oleophilic in the areas that have been exposed to heat in some manner, when the cationic group reacts with its counterion. The net result is the loss of charge. Such reactions are more easily accomplished when the anion is more nucleophilic and/or more basic. For example, an acetate anion is more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired oleophilicity of the imaged surface printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the Structure I:

I

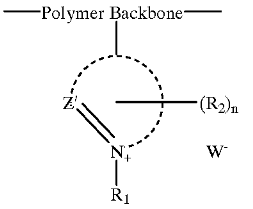

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z' represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure I, n is 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

In preferred embodiments, the polymers useful in the practice of this invention can be represented by the following Structure II:

II

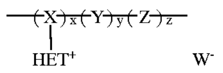

wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various repeating units are present in suitable amounts, as represented by x being from about 50 to 100 mol %, y being from about 0 to about 20 mol %, and z being from 0 to 50 mol %. Preferably, x is from about 80 to about 98 mol %, y is from about 2 to about 10 mol % and z is from 0 to about 18 mol %.

Crosslinking in preferred polymers can be provided in a number of ways. There are numerous monomers and methods for crosslinking which are familiar to one skilled in the art. Some representative crosslinking strategies include, but are not necessarily limited to:

the reaction of amine or carboxylic acid or other Lewis basic units with diepoxide crosslinkers, the reaction of epoxide units within the polymer with difunctional amines, carboxylic acids, or other difunctional Lewis basic unit, the irradiative or radical-initiated crosslinking of double bond-containing units such as acrylates, methacrylates, cinnamates, or vinyl groups, the reaction of multivalent metal salts with ligating groups within the polymer (the reaction of zinc salts with carboxylic acid-containing polymers is an example), the use of crosslinkable monomers that react via the Knoevenagel condensation reaction, such as (2-acetoacetoxy)ethyl acrylate and methacrylate, the reaction of amine, thiol, or carboxylic acid groups with a divinyl compound (such as bis (vinylsulfonyl) methane) via a Michael addition reaction, the reaction of carboxylic acid units with crosslinkers having multiple aziridine units, the reaction of crosslinkers having multiple isocyanate units with amines, thiols, or alcohols within the polymer, mechanisms involving the formation of interchain sol-gel linkages [such as the use of the 3-(trimethoxysilyl) propylmethacrylate monomer], oxidative crosslinking using an added radical initiator (such as a peroxide or hydroperoxide), autooxidative crosslinking, such as employed by alkyd resins, sulfur vulcanization, and processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by "Z" in the Structure II above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid and vinyl halides.

Particularly useful Type I polymers are identified hereinbelow as Polymers 1 and 3–6. Polymer 2 is a precursor for Polymer 3. Mixtures of these polymers can also be used.

Type II Polymers

These heat-sensitive polymers also generally have a molecular eight of at least 1000. The polymers can be any of a wide variety of non-vinyl homopolymers and copolymers, such as polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides and polybenzimidazoles. Preferably, the polymers are silicon based sol gels, polyarylene oxides, poly(phenylene sulfide) ionomers or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325, U.S. Pat. No. 2,574,902 and U.S. Pat. No. 2,597,872. Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophobic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Type I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer so that the heat-activated reaction described above can occur to provide desired oleophilicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a leaving group functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Type I polymers. The halides and carboxylates are preferred.

Particularly useful Type II polymers are identified hereinbelow as Polymers 7–8 and 10. Polymer 9 is a precursor to Polymer 10. Mixtures of these polymers can also be used.

The imaging layer of the imaging member can include one or more of such homopolymers or copolymers (one or more Type I or II polymers), with or without minor amounts (less than 20 weight %, based on total dry weight of the layer) of additional binder or polymeric materials that will not adversely affect its imaging properties. If a blend of polymers is used, they can comprise the same or different types of cationic moieties.

The amount of heat-sensitive polymer(s) used in the imaging layer is generally at least 0.1 g/m$^2$, and preferably from about 0.1 to about 10 g/m$^2$ (dry weight). This generally provides an average dry thickness of from about 0.1 to about 10 $\mu$m.

The polymers useful in this invention are readily prepared using known reactants and polymerization techniques and chemistry described in a number of polymer textbooks. Monomers can be readily prepared using known procedures or purchased from a number of commercial sources. Several synthetic methods are provided below to illustrate how such polymers can be prepared.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

Preferably, the heat-sensitive imaging layer also includes one or more photothermal conversion materials to absorb appropriate radiation from an appropriate energy source (such as a laser), which radiation is converted into heat. Thus, such materials convert photons into heat phonons. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. One particularly useful pigment is carbon of some form (for example, carbon black). The size of the pigment particles should not be more than the thickness of the layer. Preferably, the size of the particles will be half the thickness of the layer or less. Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include those illustrated as follows:

IR Dye 1

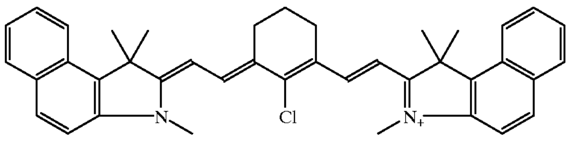

p-Toluenesulfonate$^-$

IR Dye 2

Same as Dye 1 but with $C_3F_7CO_2^-$ as the anion.

IR Dye 3

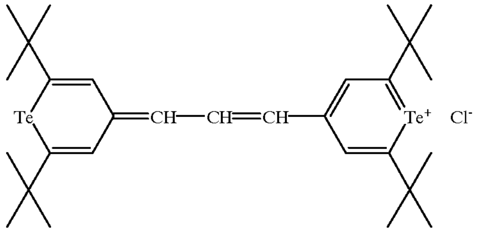

IR Dye 4

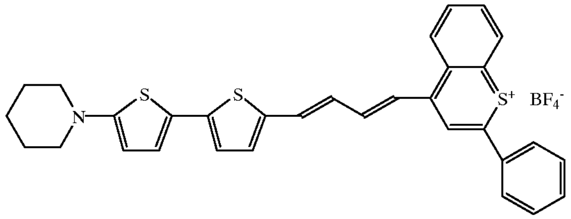

IR Dye 5

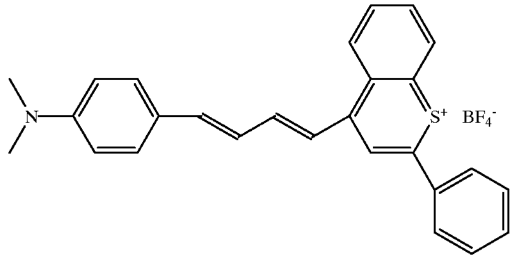

IR Dye 6

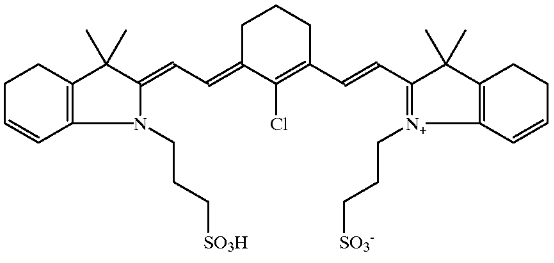

-continued

IR Dye 7

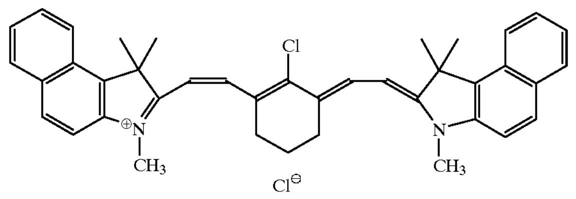

The photothermal conversion material(s) are generally present in an amount sufficient to provide a transmission optical density of at least 0.2, and preferably at least 1.0, at the operating wavelength of the imaging laser. The particular amount needed for this purpose would be readily apparent to one skilled in the art, depending upon the specific material used.

Alternatively, a photothermal conversion material can be included in a separate layer that is in thermal contact with the heat-sensitive imaging layer. Thus, during imaging, the action of the photothermal conversion material can be transferred to the heat-sensitive imaging layer without the material originally being in the same layer.

The heat-sensitive composition can be applied to the support using any suitable equipment and procedure, such as spin coating, knife coating, gravure coating, dip coating or extrusion hopper coating. The composition can also be applied by spraying onto a suitable support (such as an on-press printing cylinder) as described in U.S. Pat. No. 5,713,287 (noted above).

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive imaging layer disposed on a suitable support. Printing cylinders and sleeves (rotary printing members) have the support and heat-sensitive layer in a cylindrical form. Hollow or solid metal cores can be used as substrates for printing sleeves.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed after imaging and before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The imaging member is typically sensitized so as to maximize responsiveness at the emitting wavelength of the laser. For dye sensitization, the dye is typically chosen such that its $\lambda_{max}$ closely approximates the wavelength of laser operation.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

In a preferred embodiment of this invention, imaging efficiency can be improved by using a focused laser beam having an intensity of at least 0.1 mW/$\mu m^2$ for a time sufficient to provide a total exposure of at least 100 mJ/$cm^2$. It has been found that exposures of higher intensity and shorter time are more efficient because the laser heating becomes more adiabatic. That is, higher temperatures can be attained because conductive heat loss is minimized.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al). Thermal print heads are commercially available (for example, as Fujisu Thermal Head FTP-040 MCS001 and TDK Thermal Head F415 HH7-1089).

Without the need for any wet processing after imaging, printing can then be carried out by applying any suitable lithographic ink and fountain solution to the imaging member printing surface, and then transferring the ink to a suitable receiving material (such as cloth, paper, metal, glass or plastic) to provide a desired impression of the image thereon. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way.

Polymers 1 and 3–6 are illustrative of Type I polymers, and Polymers 7–8 and 10 are illustrative of Type II polymers. Polymers 2 and 9 are precursors to Polymers 3 and 10, respectively.

Synthetic Methods

Preparation of Polymer 1

Poly (1-vinyl-3-methylimidazolium chloride-co-N-(3-aminopropyl) methacrylamide hydrochloride)

A] Preparation of 1-Vinyl-3-methylimidazolium methanesulfonate monomer:

Freshly distilled 1-vinylimidazole (20.00 g, 0.21 mol) was combined with methyl methanesulfonate (18.9 ml, 0.22 mol) and 3-t-butyl-4-hydroxy-5-methylphenyl sulfide (about 1 mg) in diethyl ether (100 ml) in a round bottomed flask equipped with a reflux condenser and a nitrogen inlet and stirred at room temperature for 48 hours. The resulting precipitate was filtered off, thoroughly washed with diethyl ether, and dried overnight under vacuum at room temperature to afford 37.2 g of product as a white, crystalline powder (86.7% yield).

B] Copolymerization/ion exchange:

1-Vinyl-3-methylimidazolium methanesulfonate (5.00 g, $2.45\times10^{-2}$ mol), N-(3-aminopropyl) methacrylamide hydrochloride (0.23 g, $1.29\times10^{-3}$ mol) and 2,2'-azobisisobutyronitrile (AIBN) (0.052 g, $3.17\times10^{-4}$ mol) were dissolved in methanol (60 ml) in a 250 ml round bottomed flask equipped with a rubber septum. The solution was bubble degassed with nitrogen for ten minutes and heated at 60° C. in a water bath for 14 hours. The viscous solution was precipitated into 3.5 liters of tetrahydrofuran and dried under vacuum overnight at 50° C. to give 4.13 g of product (79.0% yield). The polymer was then dissolved in 100 ml methanol and converted to the chloride by passage through a flash column containing 400 $cm^3$ DOWEX® 1X8–100 ion exchange resin.

Preparation of Polymer 2

Poly(methyl methacrylate-co-4-vinylpyridine)(9: 1 molar ratio)

Methyl methacrylate (30 ml), 4-vinylpyridine (4 ml), AIBN (0.32 g, $1.95\times10^{-3}$ mol), and N,N-dimethylformamide (40 ml, DMF) were combined in a 250 ml round bottomed flask and fitted with a rubber septum. The solution was purged with nitrogen for 30 minutes and heated for 15 hours at 60° C. Methylene chloride and DMF (150 ml of each) were added to dissolve the viscous product and the product solution was precipitated twice into isopropyl ether. The precipitated polymer was filtered and dried overnight under vacuum at 60° C.

Preparation of Polymer 3

Poly(methyl methacrylate-co-N-methyl-4-vinylpyridinium formate) (9:1 molar ratio)

Polymer 2 (10 g) was dissolved in methylene chloride (50 ml) and reacted with methyl p-toluenesulfonate (1 ml) at reflux for 15 hours. NMR analysis of the reaction showed that only partial N-alkylation had occurred. The partially reacted product was precipitated into hexane, then dissolved in neat methyl methanesulfonate (25 ml) and heated at 70° C. for 20 hours. The product was precipitated once into diethyl ether and once into isopropyl ether from methanol and dried under vacuum overnight 60° C. A flash chromatography column was loaded with 300 $cm^3$ of DOWEX® 550 hydroxide ion exchange resin in water eluent. This resin was converted to the formate by running a liter of 10% formic acid through the column. The column and resin were thoroughly washed with methanol, and the product polymer (2.5 g) was dissolved in methanol and passed through the column. Complete conversion to the formate counterion was confirmed by ion chromatography.

Preparation of Polymer 4

Poly(methyl methacrylate-co-N-butyl-4-vinylpyridinium formate) (9:1 molar ratio)

Polymer 2 (5 g) was heated at 60° C. for 15 hours in 1-bromobutane (200 ml). The precipitate that formed was dissolved in methanol, precipitated into diethyl ether, and dried for 15 hours under vacuum at 60° C. The polymer was converted from the bromide to the formate using the method described in the preparation of Polymer 3.

Preparation of Polymer 5

Poly(methyl methacrylate-co-2-vinylpyridine) (9:1 molar ratio)

Methyl methacrylate (18 ml), 2-vinylpyridine (2 ml), AIBN (0.16 g,), and DMF (30 ml) were combined in a 250 ml round bottomed flask and fitted with a rubber septum. The solution was purged with nitrogen for 30 minutes and heated for 15 hours at 60° C. Methylene chloride (50 ml) was added to dissolve the viscous product and the product solution was precipitated twice into isopropyl ether. The precipitated polymer was filtered and dried overnight under vacuum at 60° C.

Preparation of Polymer 6

Poly(methyl methacrylate-co-N-methyl-2-vinylpyridinium formate) (9:1 molar ratio)

Polymer 5 (10 g) was dissolved in 1,2-dichloroethane (100 ml) and reacted with methyl p-toluenesulfonate (15 ml) at 70° C. for 15 hours. The product was precipitated twice into diethyl ether and dried under vacuum overnight at 60° C. A sample (2.5 g) of this polymer was converted from the p-toluenesulfonate to the formate using the procedure described above for Polymer 3.

Preparation of Polymer 7

Poly(p-xylidenetetrahydro-thiophenium chloride)

Xylylene-bis-tetrahydrothiophenium chloride (5.42 g, 0.015 mol) was dissolved in 75 ml of deionized water and filtered through a fritted glass funnel to remove a small amount of insolubles. The solution was placed in a three-neck round-bottomed flask on an ice bath and was sparged with nitrogen for fifteen minutes. A solution of sodium hydroxide (0.68 g, 0.017 mol) was added dropwise over fifteen minutes via addition funnel. When about 95% of the hydroxide solution was added, the reaction solution became very viscous and the addition was stopped. The reaction was brought to pH 4 with 10% HCl and purified by dialysis for 48 hours.

Preparation of Polymer 8

Poly[phenylene sulfide-co-methyl(4-thiophenyl) sulfonium chloride]

Poly (phenylene sulfide) (15.0 g, 0.14 mol-repeating units), methanesulfonic acid (75 ml), and methyl triflate (50.0 g, 0.3 mol) were combined in a 500 ml round bottomed flask equipped with a heating mantle, reflux condenser, and nitrogen inlet. The reaction mixture was heated to 90° C. at which point a homogeneous, brown solution resulted, and was allowed to stir at room temperature overnight. The reaction mixture was poured into 500 $cm^3$ of ice and brought to neutrality with sodium bicarbonate. The resultant liquid/solid mixture was diluted to a final volume of 2 liters with water and dialyzed for 48 hours at which point most of the solids had dissolved. The remaining solids were removed by filtration and the remaining liquids were slowly concentrated to a final volume of 700 ml under a stream of nitrogen. The polymer was ion exchanged from the triflate to the chloride by passing it through a column of DOWEX® 1×8–100 resin. Analysis by $^1H$ NMR showed that methylation of about 45% of the sulfur groups had occurred.

Preparation of Polymer 9

Brominated poly(2,6-dimethyl-1,4-phenylene oxide)

Poly (2,6-dimethyl-1,4-phenylene oxide) (40 g, 0.33 mol repeating units) was placed dissolved in carbon tetrachloride (2400 ml) in a 5 liter round bottomed 3-neck flask with a reflux condenser and a mechanical stirrer. The solution was heated to reflux and a 150 Watt flood lamp was applied. N-bromosuccinimide (88.10 g, 0.50 g) was added portion-wise over 3.5 hours, and the reaction was allowed to stir at reflux for an additional hour. The reaction was cooled to room temperature to yield an orange solution over a brown solid. The liquid was decanted and the solids were stirred with 100 ml methylene chloride to leave a white powder (succinimide) behind. The liquid phases were combined, concentrated to 500 ml via rotary evaporation, and precipitated into methanol to yield a yellow powder. The crude product was precipitated twice more into methanol and dried overnight under vacuum at 60° C. Elemental and $^1H$ NMR analyses showed a net 70% bromination of benzyl side chains.

Preparation of Polymer 10

Dimethyl sulfonium bromide derivative of poly(2,6-dimethyl-1,4-phenylene oxide)

Brominated poly(2,6-dimethyl-1,4-phenylene oxide) described above (2.00 g, 0.012 mol benzyl bromide units) was dissolved in methylene chloride (20 ml) in a 3-neck round bottomed flask outfitted with a condenser, nitrogen inlet, and septum. Water (10 ml) was added along with dimethyl sulfide (injected via syringe) and the two phase mixture was stirred at room temperature for one hour and then at reflux at which point the reaction turned into a thick dispersion. This was poured into 500 ml of tetrahydrofuran and agitated vigorously in a chemical blender. The product, which gelled after approximately an hour in the solid state, was recovered by filtration and quickly redissolved in 100 ml methanol and stored as a methanolic solution.

EXAMPLE 1

Carbon Sensitized Printing Plate Prepared Using Polymer 1

A melt was prepared by dissolving 0.254 g of Polymer 1 in 4.22 g of a mixture of methanol and water (3/1 w/w). A dispersion of carbon in water [(0.169 g, 15 wt % carbon having quaternary amines on particle surfaces (prepared as described by Johnson, IS&T's 50$^{th}$ Annual Conference, Cambridge, Mass., May 18–23, 1997, pp. 310–312)] was added. After mixing, and just before coating, a solution of bisvinylsulfonylmethane (BVSM, 0.353 g, 1.8% by weight in water) was added and the mixture was coated with a wire wound rod on a K Control Coater (Model K202, RK Print-Coat Instruments LTD) to a wet thickness of 25 μm on gelatin-subbed poly(ethylene terephthalate). The coatings were dried for four minutes at 70–80° C. The coating coverages are summarized in TABLE I below.

EXAMPLE 2

Dye Sensitized Printing Plate Prepared Using Polymer 1

A melt was prepared by dissolving 0.254 g of Polymer 1 and 0.025 g of IR Dye 7 in 4.37 g of a mixture of methanol and water (3/1 w/w). After mixing, and just before coating, a solution of bis-vinylsulfonylmethane (BVSM, 0.353 g, 1.8% by wt. in water) was added and the mixture was coated with a wire wound rod on a K Control Coater (Model K202, RK Print-Coat Instruments LTD) to a wet thickness of 25 μm on gelatin-subbed poly(ethylene terephthalate). The coatings were dried in an oven for four minutes at 70–80° C. The coating coverages are summarized in TABLE I below.

The printing plates of Examples 1 and 2 were exposed in an experimental platesetter having an array of laser diodes operating at a wavelength of 830 nm, each focused to a spot diameter of 23 μm. Each channel provides a maximum of 450 mW of power incident on the recording surface. The plates were mounted on a drum whose rotation speed was varied to provide for a series of images set at various exposures as listed in TABLE I below. The laser beams were modulated to product halftone dot images.

TABLE I

| | Coverage ($g/m^2$) | | | Imaging conditions | |
|---|---|---|---|---|---|
| | Polymer | Carbon black or IR Dye 7 | BVSM | Power (mW) | Exposure ($mJ/cm^2$) |
| Example 1 | 1.08 | 0.108 | 0.027 | 356 | 360 |
| " | " | " | " | " | 450 |
| " | " | " | " | " | 600 |
| " | " | " | " | " | 900 |
| Example 2 | " | " | " | 356 | 360 |
| " | " | " | " | " | 450 |
| " | " | " | " | " | 600 |
| " | " | " | " | " | 900 |

The plates were mounted on a commercially available A.B. Dick 9870 duplicator press and prints were made using VanSon Diamond Black ink and Universal Pink fountain solution containing PAR alcohol substitute (Varn Products Company, Inc.). The plates gave acceptable negative images to at least 1000 impressions. The non-imaged areas of the plates did not wash off during printing, indicating that effective adhesion and cross-linking was attained in the plate formulation.

EXAMPLE 3

Printing Plate Prepared Using Polymer 3

A polymer/dye solution was made consisting of Polymer 3 (0.10 g) and IR Dye 2 (0.013 g) dissolved in 9.9 g of 3:1 methanol/tetrahydrofuran (THF). This solution was coated onto a 150 μm thick grained anodized aluminum support at a wet coverage of 101 $cm^3/m^2$. When dye, the printing plate was exposed to a focused laser beam at 830 nm wavelength on an apparatus similar to that described in Example 2 above. The exposure level was about 1000 mJ/cm$^2$ and the intensity of the beam was about 3 mW/$\mu$m$^2$. The laser beam was modulated to produce a halftone dot image. The imaged plate was wetted with running water and rubbed with Van Son Diamond ink using a cloth wet with water. The imaged (exposed) areas of the plate tool ink readily while the non-imaged (unexposed) areas took no ink.

EXAMPLE 4

Printing Plate Prepared Using Polymer 4

A polymer/dye solution was made consisting of Polymer 4 (0.54 g) and IR Dye 2 (0.068 g) dissolved in 19.3 g of 7:3 methanol/THF. This solution was coated on a 150 $\mu$m grained anodized aluminum support at a wet coverage of 50 cm$^3$/m$^2$. When dry, the resulting printing plate was exposed to a focused diode laser beam at 830 nm wavelength as described in Example 3. The exposure level was about 1000 mJ/cm$^2$ and the intensity of the beam was about 3 mW/$\mu$m$^2$. The laser beam was modulated to produce a halftone dot image.

The imaged printing plate was wetted with running water and rubbed with Van Son Black Diamond ink using a cloth wet with water. The imaged (exposed) areas of the plate took ink readily while the non-imaged (unexposed) areas took no ink.

EXAMPLE 5

Printing Plate Prepared Using Polymer 6

A polymer/dye solution was made consisting of Polymer 6 (0.56 g) and IR Dye 2 (0.068 g) dissolved in 19.31 g of 3:1 methanol/THF. This solution was coated on a 150 $\mu$m grained anodized aluminum support at a wet coverage of 50 cm$^3$/m$^2$. When dry, the resulting printing plate was exposed to a focused diode laser beam at 830 nm wavelength as described in Example 3. The exposure level was about 1000 mJ/cm$^2$ and the intensity of the beam was about 3 mW/$\mu$m$^2$. The laser beam was modulated to produce a halftone dot image.

The imaged printing plate was wetted with running water and rubbed with Van Son Black Diamond ink using a cloth wet with water. The imaged (exposed) areas of the plate took ink readily while the non-imaged (unexposed) areas took no ink.

EXAMPLE 6

Printing Plate Prepared Using Polymer 7

A solution (11.78 g) of poly(p-xylidenetetrahydrothiophenium chloride) (3.41% polymer by weight in 1:1 methanol:water) was combined with a solution (0.080 g) of IR Dye 6 dissolved in methanol (3.14 g). The solution was coated onto a plate of 150 $\mu$m thick grained, anodized aluminum support at a wet coverage of 67 g/m$^2$.

After drying, the resulting printing plate was imaged as described in Example 2 above at 830 nm wavelength. The exposure level was about 1000 mJ/cm$^2$, and the laser intensity was about 3 mW/$\mu$m$^2$.

The imaged, negative-working printing plate was wet with running water and rubbed with Van Son Diamond Black ink using a cloth wet with water. The imaged (exposed) areas of the plate took ink readily while the non-imaged (unexposed background) areas took no ink.

EXAMPLE 7

Printing Plate Prepared Using Polymer 8

A solution (12.76 g) of poly(phenylene sulfide-co-methyl (4-thiophenyl)sulfonium chloride) (3.0% by weight in 3:1 water:acetonitrile) was combined with 0.504 g of the carbon dispersion of Example 1, 15.2% solids, in water), 1.30 g of acetonitrile and 0.435 g of water. The dispersion was coated onto a plate of 150 $\mu$m thick grained, anodized aluminum support at a wet coverage of 67 g/m$^2$.

Upon drying, the resulting printing plate was imaged as described in Example 6 above. The imaged printing plate was then wetted with running water and rubbed with Van Son Diamond Black ink using a cloth wet with water. The imaged (exposed) areas of the plate took ink readily while the non-imaged (unexposed background) areas were washed off the plate and took no ink.

Another imaged printing plate of this type was mounted on a commercially available A.B. Dick 9870 duplicator printing press and used to make 500 distinct impressions of good quality.

EXAMPLE 8

Printing Plate Prepared Using Polymer 10

A solution of Polymer 9 (3.29% by weight in methanol) was combined with the carbon black dispersion of Example 1 (0.223 g, 15.2% solids, in water), and water (6.625 g). The resulting dispersion was coated onto a 150 $\mu$m grained, anodized aluminum support at a wet coverage of 100 g/m$^2$.

After drying, the resulting printing plate was imaged as described in Example 6 above. The imaged plate was wetted with running water, and rubbed with Van Son Diamond Black ink using a cloth wetted with water. The imaged areas readily took ink while the non-imaged areas did not and were readily washed off the support.

EXAMPLE 9

Printing Plate Prepared Using a Sol-Gel

A solution (6 ml) of N-trimethoxysilyl-propyl-N,N',N"-trimethyl ammonium acetate in methanol was mixed with 2 ml of commercially available CAB-O-JET™ 200 (20% solubilized carbon in water from the Cabot Corporation, Billerica, Mass.) and the resulting sol-gel dispersion was coated on grained, anodized aluminum with a coating knife. After drying, the resulting printing plate was baked at 100° C. for 15 minutes. The printing plate was then imaged as described in Example 2 at 830 nm wavelength, an exposure level was about 600 mJ/cm$^2$, and an intensity of about 3 mW/$\mu$m$^2$.

After exposure, the printing plate was mounted on a commercial A. B. Dick 9870 duplicator printing press and 100 distinct impressions were made.

EXAMPLE 10

Printing Plate Prepared Using Polymer 10

A dispersion of a solution of Polymer 10 (12.76 g, 3% by weight in a 3:1 mixture of water and acetonitrile), the carbon black dispersion of Example 1 (0.504 g, 15.2% solids in water), acetonitrile (1.30 g) and water (0.435 g) was prepared and coated onto a 150 $\mu$m grained, anodized aluminum support at a wet coverage of 67 g/m$^2$.

After drying, the resulting printing plate was imaged in the device described in Example 2 using a focused diode laser beam at 830 nm, and an intensity that was stepwise modulated in 40 steps from full intensity down by 6/256 of the total intensity in each step. The stepwise exposures were made at four different drum rotation speeds. The resulting set of step wedge exposures provided a set of different exposure intensities for different lengths of time.

After exposure, the printing plate was mounted on a conventional A.B. Dick 9870 duplicator printing press and 1000 impressions were made. The 100th impression in each run was selected, and the last (lowest power) step that printed to more than 50% ink density for each drum rotation speed was determined. The laser intensity for each step is the laser power at that step divided by the area of the laser spot. The area of the laser spot was measured by a laser beam profilometer, and was 25x12 $\mu$m at the $1/e^2$ point for each of the lowest full density steps, the exposure and intensity were calculated. The results are listed in the following TABLE II:

TABLE II

| Rotation Speed (rpm) | Lowest Good Step | Exposure ($mJ/cm^2$) | Intensity ($mW/\mu m^2$) |
|---|---|---|---|
| 400 | 25 | 661 | 0.826 |
| 600 | 21 | 608 | 1.01 |
| 800 | 13 | 556 | 1.39 |
| 1000 | 11 | 475 | 1.48 |

These data show that the use of a higher intensity laser beam is more efficient and requires less total exposure energy to achieve desired imaging, and subsequently, printing.

The invention has been described in detail with particular reference to preferred embodiments thereof, but it will be understood that variations and modifications can be effected within the spirit and scope of the invention.

We claim:

1. An imaging member comprising a support having thereon a hydrophilic imaging layer comprising a hydrophilic heat-sensitive imaging polymer wherein post imaging wet processing of the member to remove non-imaged areas is not required, and the polymer is selected from the following two groups of polymers:

I) a cross-linked vinyl polymer comprising recurring units comprising a positively-charged, pendant N-alkylated aromatic heterocyclic group, and II) a non-vinyl polymer comprising recurring organosulfonium or organophosphonium groups.

2. The imaging member of claim 1 further comprising a photothermal conversion material.

3. The imaging member of claim 2 wherein said photothermal conversion material is an infrared radiation absorbing material and is present in said imaging layer.

4. The imaging member of claim 2 wherein said photothermal conversion material is carbon black or an infrared radiation absorbing dye.

5. The imaging member of claim 1 comprising a polyester or aluminum support.

6. The imaging member of claim 1 wherein said heat-sensitive polymer is represented by the Structure I:

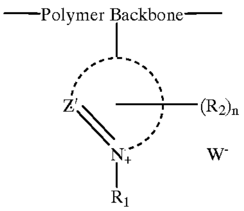

I wherein $R_1$ is an alkyl group, $R_2$ is an alkyl group, an alkoxy group, an aryl group, an alkenyl group, halogen, a cycloalkyl group, or a heterocyclic group having 5 to 8 atoms in the ring, Z' represents the carbon and nitrogen, oxygen, or sulfur atoms necessary to complete an aromatic N-heterocyclic ring having 5 to 10 atoms in the ring, n is 0 to 6, and $W^-$ is an anion.

7. The imaging member of claim 6 wherein $R_1$ is an alkyl group of 1 to 6 carbon atoms, $R_2$ is a methyl, ethyl or n-propyl group, Z' represents the carbon, nitrogen, oxygen, or sulfur atoms to complete a 5-membered ring, and n is 0 or 1.

8. The imaging member of claim 1 wherein said heat-sensitive polymer is represented by the Structure II:

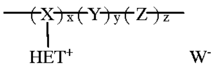

II wherein $HET^+$ represents a positively-charged, pendant N-alkylated aromatic heterocyclic group, X represents recurring units having attached $HET^+$ groups, Y represents recurring units derived from ethylenically unsaturated polymerizable monomers that provide active crosslinking sites, Z represents recurring units for additional ethylenically unsaturated monomers, x is from about 50 to 100 mol %, y is from 0 to about 20 mol %, z is from 0 to about 50 mol %, and $W^-$ is an anion.

9. The imaging member of claim 8 wherein x is from about 80 to about 98 mol %, y is from about 2 to about 10 mol %, z is from 0 to about 18 mol %.

10. The imaging member of claim 8 wherein said positively-charged, pendant N-alkylated aromatic heterocyclic group is an imidazolium group.

11. The imaging member of claim 1 wherein said heat-sensitive Type II polymer and is a polyester, polyamide, polyamide-ester, polyarylene oxide or a derivative thereof, polyurethane, polyxylylene or a derivative thereof, a poly (phenylene sulfide) ionomer, a silicon-based sol gel, polyamidoamine, polyimide, polysulfone, polysiloxane, polyether, poly(ether ketone), or polybenzimidazole.

12. The imaging member of claim 11 wherein said heat-sensitive Type II polymer is a silicon-based sol gel, polyarylene oxide or poly(phenylene sulfide) ionomer.

13. The imaging member of claim 1 wherein said organoonium moiety is a pendant group on the backbone of said Type II polymer.

14. The imaging member of claim 13 wherein said organoonium moiety is a pendant quaternary ammonium moiety.

15. The imaging member of claim 1 wherein said heat-sensitive polymer has a halide or carboxylate anion.

16. The imaging member of claim 1 wherein said heat-sensitive polymer is present in said imaging layer in an amount of at least 0.1 $g/m^2$.

17. The imaging member of claim 1 wherein said support is an on-press printing cylinder.

18. A method of imaging comprising the steps of:

A) providing the imaging member of claim 1, and

B) imagewise exposing said imaging member to energy to provide exposed and unexposed areas in the imaging layer of said imaging member, whereby said exposed areas are rendered more oleophilic than said unexposed areas by heat provided by said imagewise exposing.

19. The method of claim 18 wherein said imagewise exposing is carried out using an IR radiation emitting laser, and said imaging member is a lithographic printing plate comprising a photothermal conversion material in said imaging layer.

20. The method of claim 19 wherein said IR radiation emitting laser is used at an intensity of at least 0.1 $mW/m^2$ for a time sufficient to provide a total exposure of at least 100 $mJ/cm^2$.

21. The method of claim 18 wherein said imagewise exposing is accomplished using a thermal head.

22. The method of claim 18 wherein said imaging member is provided in step A by spraying a formulation of said heat-sensitive polymer onto a cylindrical support.

23. A method of printing comprising the steps of:

A) providing the imaging member of claim 1,

B) imagewise exposing said imaging member to thermal energy to provide exposed and unexposed areas in the imaging layer of said imaging member, whereby said exposed areas are rendered more oleophilic than said unexposed areas by heat provided by said imagewise exposing, and C) contacting said imagewise exposed imaging member with a fountain solution and a lithographic printing ink, and imagewise transferring said ink to a receiving material.

24. An imaging member comprising a support having thereon a hydrophilic imaging layer capable of being imaged by IR radiation comprising a hydrophilic heat-sensitive imaging cross-linked vinyl polymer comprising recurring units comprising a positively-charged, pendant N-alkylated aromatic heterocyclic group, wherein the polymer is of Structure I:

I

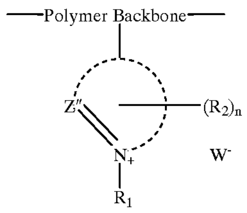

wherein $R_1$ is an alkyl group, $R_2$ is an alkyl group, an alkoxy group, an aryl group, an alkenyl group, a halogen, a cycloalkyl group, or a heterocyclic group having 5 to 8 atoms in the ring, Z' represents the carbon and nitrogen, oxygen, or sulfur atoms necessary to complete an aromatic N-heterocyclic ring having 5 to 10 atoms in the ring, n is 0 to 6, and $W^-$ is an anion, or the polymer is of Structure II:

II

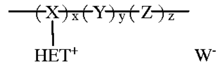

wherein HET+ represents a positively-charged, pendant N-alkylated aromatic heterocyclic group which is an imidazolium group, X represents recurring units having attached HET+ groups, Y represents recurring units derived from ethylenically unsaturated polymerizable monomers that provide active crosslinking sites, Z represents recurring units for additionally ethylenically unsaturated monomers, x is from about 50 to 100 mol %, y is from 0 to about 20 mol %, z is from 0 to about 50 mol %, and $W^-$ is an anion.

25. The imaging member of claim 24, wherein $R_1$ is an alkyl group of 1 to 6 carbon atoms, $R_2$ is a methyl, ethyl or n-propyl group, Z' represents the carbon, nitrogen, oxygen and sulfur atoms to complete a 5-membered ring, and n is 0 or 1.

* * * * *

UNITED STATES PATENT AND TRADEMARK OFFICE

CERTIFICATE OF CORRECTION

PATENT NO. : 6,190,831,B1
DATED : February 20, 2001
INVENTOR(S) : Leon et al.

It is certified that error appears in the above-identified patent and that said Letters Patent is hereby corrected as shown below:

Title page,
Item [56], References Cited, OTHERE PUBLICATIONS: Under Rosen, "Princples" should read -- Principles --

Item [75], Inventor(s): "Deboer" should read -- Deboer --

Column 1,
Line 11, "now abandoned and Deboer" should read -- and Deboer, now abandoned. --
Line 64, "CO2" should read -- $CO_2$ --

Column 3,
Line 61-62, delete "is that such polymers"

Column 7,
Line 13, "unit," should read -- units, --

Column 15,
Line 63, "[0.169 g" should read -- [0.169 g --

Column 16,
Line 66, "dye," should read -- dry --

Column 20,
Line 43, "z" should read -- and z --
Line 48, "and" should be deleted
Lines 58-59, "organoonium" should read -- organosulfonium or organosphonium --
Line 61, "organoonium" should read -- organosulfonium or organophosphonium --

Signed and Sealed this

Fifth Day of February, 2002

*Attest:*

JAMES E. ROGAN
*Director of the United States Patent and Trademark Office*

*Attesting Officer*